(12) United States Patent
Singh et al.

(10) Patent No.: US 7,078,348 B1
(45) Date of Patent: Jul. 18, 2006

(54) DUAL LAYER PATTERNING SCHEME TO MAKE DUAL DAMASCENE

(75) Inventors: Bhanwar Singh, Morgan Hill, CA (US); Ramkumar Subramanian, San Jose, CA (US); Bharath Rangarajan, Santa Clara, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 556 days.

(21) Appl. No.: 09/893,188

(22) Filed: Jun. 27, 2001

(51) Int. Cl.
*H01L 21/302* (2006.01)
*H01L 21/3065* (2006.01)

(52) U.S. Cl. .................. 438/700; 438/736; 216/47
(58) Field of Classification Search .......... 216/47; 438/736, 700
See application file for complete search history.

(56) References Cited

U.S. PATENT DOCUMENTS

| | | | | |
|---|---|---|---|---|
| 4,165,395 A | * | 8/1979 | Chang | 427/493 |
| 4,645,562 A | * | 2/1987 | Liao et al. | 156/637 |
| 5,290,664 A | * | 3/1994 | Matsumoto | 430/296 |
| 5,543,253 A | * | 8/1996 | Park et al. | 439/5 |
| 5,635,337 A | * | 6/1997 | Bartha et al. | 430/323 |
| 5,821,169 A | | 10/1998 | Nguyen et al. | 438/736 |
| 5,877,075 A | | 3/1999 | Dai et al. | 438/597 |
| 5,877,076 A | | 3/1999 | Dai | 438/597 |
| 6,077,733 A | | 6/2000 | Chen et al. | 438/182 |
| 6,207,546 B1 | | 3/2001 | Chen et al. | 438/612 |
| 6,218,082 B1 | * | 4/2001 | Yang | 430/325 |
| 6,221,989 B1 | * | 4/2001 | Furihata et al. | 526/261 |

* cited by examiner

*Primary Examiner*—Nadine Norton
*Assistant Examiner*—Lynette T. Umez-Eronini
(74) *Attorney, Agent, or Firm*—Amin & Turocy, LLP

(57) ABSTRACT

One aspect of the present invention relates to a method for making a dual damascene pattern in an insulative layer in a single etch process involving providing a wafer having at least one insulative layer formed thereon; depositing a first photoresist layer over the at least one insulative layer; patterning a first image into the first photoresist layer; curing the first patterned photoresist layer; depositing a second photoresist layer over the first patterned photoresist layer; patterning a second image into the second photoresist layer; and etching the at least one insulative layer through the first patterned photoresist layer and the second patterned photoresist layer simultaneously in the single etch process.

18 Claims, 6 Drawing Sheets

DUAL LAYER PATTERNING SCHEME TO MAKE DUAL DAMASCENE

TECHNICAL FIELD

The present invention generally relates to the fabrication of integrated circuit devices. In particular, the present invention relates to a method for fabricating interconnecting conductive lines and vias using a dual damascene process with a dual layer patterning scheme and accomplishing the same in a single etch process.

BACKGROUND ART

In the semiconductor industry, there is a continuing trend toward higher device densities. To achieve these high densities there has been and continues to be efforts toward scaling down the device dimensions on semiconductor wafers (e.g., at submicron levels). In order to accomplish such high device packing density, smaller and smaller features sizes are required. This may include the width and spacing of interconnecting lines, spacing and diameter of contact holes and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

The ability to reduce the size of computer chips while increasing packing densities and performance is driven by lithography technology and metallization processes and is especially critical to ultra large scale integration (ULSI) circuits. ULSI circuits require responsive changes in interconnection technology which is considered a very demanding aspect of ULSI technology. High density demands for ULSI integration require planarizing layers with minimal spacing between conductive lines.

Single damascene is a technique developed to address disadvantages (e.g., poor metal step coverage, residual metal shorts, low yields, uncertain reliability, and poor ULSI integration extendability) associated with traditional etch back methods. Damascene, an art which has been employed for centuries in the fabrication of jewelry, has been adapted for application in the semiconductor industry. Damascene basically involves the formation of a trench which is filled with a metal. Thus, damascene differs from traditional etch back methods which involve building up a metal wiring layer and filling the interwiring spaces with a dielectric material.

Single damascene techniques offer the advantage of improved planarization as compared to etch back methods; however, single damascene is time consuming in that numerous process steps are required. Undesirably, an interface exists between the conductive via and conductive wiring. Moreover, adequate planarization layers containing an inter-wiring spacing less than 0.35 µm are difficult to achieve.

An improvement to single damascene is dual damascene which involves substantially simultaneous formation of a conductive via and conductive wiring. The dual damascene technique requires less manipulative steps than the single damascene technique and eliminates the interface between the conductive via and conductive wiring which is typically formed by the single damascene technique. In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect active and/or passive elements of the integrated circuit. The dual damascene process also is used for forming multilevel signal lines of metal, such as copper, in the insulating layers, such as polyimide, of a multilayer substrate on which semiconductor devices are mounted.

As previously mentioned, dual damascene is a multi-level interconnection process in which, in addition to forming the grooves of single damascene, conductive via openings also are formed. In a standard dual damascene process, the insulating layer is coated with a first photoresist which is exposed through a first mask with an image pattern of the via openings and the pattern is anisotropically etched in the upper half region of the insulating layer. The photoresist is now exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps.

A conventional dual damascene process is illustrated in FIGS. 1–3 in connection with a semiconductor structure 10. FIG. 1 illustrates a perspective view of an insulative oxide layer 14 formed on a semiconductor substrate 12. A photoresist layer 16 is formed on the insulative oxide layer 14. The photoresist layer 16 is patterned using conventional techniques to form first openings 18. Anisotropic reactive ion etching (RIE) is performed to form vias 20 (FIG. 2) in the insulative oxide layer 14. Subsequently, the photoresist 16 is exposed to a second mask with an image pattern of conductive lines and is transformed into photoresist 22 (FIG. 2).

Following exposure to the second mask, the photoresist layer 22 has second openings 24 (FIG. 2) about the size of the ultimate trench therein. Anisotropic RIE is again performed to form a trench 26 (FIG. 3) in the insulative oxide layer 14.

Other conventional dual damascene processes employ a multi-layer dielectric/insulative layer including an etch stop layer formed in between a top and a bottom oxide layer. This type of semiconductor structure must be subjected to multiple etch processes in order to fully transfer the via and conductive line patterns from upper photoresist layers to the underlying dielectric multi-layer structure.

Although these known dual damascene techniques offers advantages over other processes for forming interconnections, the repetitive sequence of patterning and etching can be cumbersome and the likelihood of damage to a partially fabricated semiconductor structure increases with each sequence of patterning and etching.

In view of the above, there is an unsatisfied need for a modified dual damascene process involving fewer processing steps. More specifically, there is an unsatisfied need for a dual damascene process having a single etch step.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a method for fabricating interconnecting conductive lines and vias using a modified dual damascene process. The modified dual damascene process involves a dual layer patterning scheme and a single etch process. The dual layer patterning scheme consists of a first patterned photoresist layer and a second patterned photoresist layer formed directly thereon. In particular, the first patterned photoresist layer has been stabilized, thereby making it chemically resistant to conventional organic solvents and developers typically associated with patterning photoresist films. In addition, the present invention obviates the need for an etch stop layer such as, for example, between a dielectric layer (i.e., to be etched) and the substrate or an etch stop layer sandwiched between a top and a bottom dielectric layer. The via and conductive line patterns may be transferred directly to the underlying oxide layer without substantially affecting or impacting the substrate which not only reduces overall processing steps, time, and costs but also mitigates the occurrence of errors caused by misalignment of the layers being etched.

One aspect of the present invention relates to a method for making a dual damascene pattern involving the steps of providing a wafer having at least one insulative layer formed thereon; depositing a first photoresist layer over the at least one insulative layer; patterning a first image into the first photoresist layer; curing the first patterned photoresist layer; depositing a second photoresist layer over the first patterned photoresist layer; patterning a second image into the second photoresist layer; and etching the at least one insulative layer through the first patterned photoresist layer and the second patterned photoresist layer simultaneously in a single etch process.

Another aspect of the present invention relates to a method for making a dual damascene pattern using a dual layer patterning scheme and a single etch process involving the steps of providing a wafer having at least one insulative layer formed thereon; depositing a first photoresist layer over the at least one insulative layer; patterning a first image in the first photoresist layer; irradiating the first patterned photoresist layer with ultraviolet light to stabilize the first patterned photoresist layer; depositing a second photoresist layer on the first patterned photoresist layer; patterning a second image in the second photoresist layer; etching the at least one insulative layer through the first patterned photoresist layer and the second patterned photoresist layer simultaneously in the single etch process, wherein the first image and the second image are substantially formed in the at least one insulative layer; and removing the first patterned and the second patterned photoresist layers.

Yet another aspect of the present invention relates to a method for making a dual damascene pattern using a dual layer patterning scheme. The method includes the steps of providing a wafer having at least one insulative layer formed thereon; depositing a positive tone photoresist layer over the at least one insulative layer; patterning a first image in the positive tone photoresist layer; irradiating selected portions of the positive tone photoresist through a mask to effect an image-wise pattern transfer, wherein the irradiated portions of the positive tone photoresist layer are removed; polymerizing the first patterned photoresist layer using ultraviolet light radiation; depositing a negative tone photoresist layer over the patterned positive tone photoresist layer; irradiating selected portions of the negative tone photoresist through a mask to effect an image-wise pattern transfer, wherein the non-irradiated portions of the negative tone photoresist layer are removed; etching the at least one insulative layer through the patterned positive tone photoresist layer and the patterned negative photoresist layer simultaneously in a single etch process, wherein the first image and the second image are substantially formed in the at least one insulative layer; and removing the patterned positive tone and the patterned negative tone photoresist layers.

DISCLOSURE OF INVENTION

Figure 1:
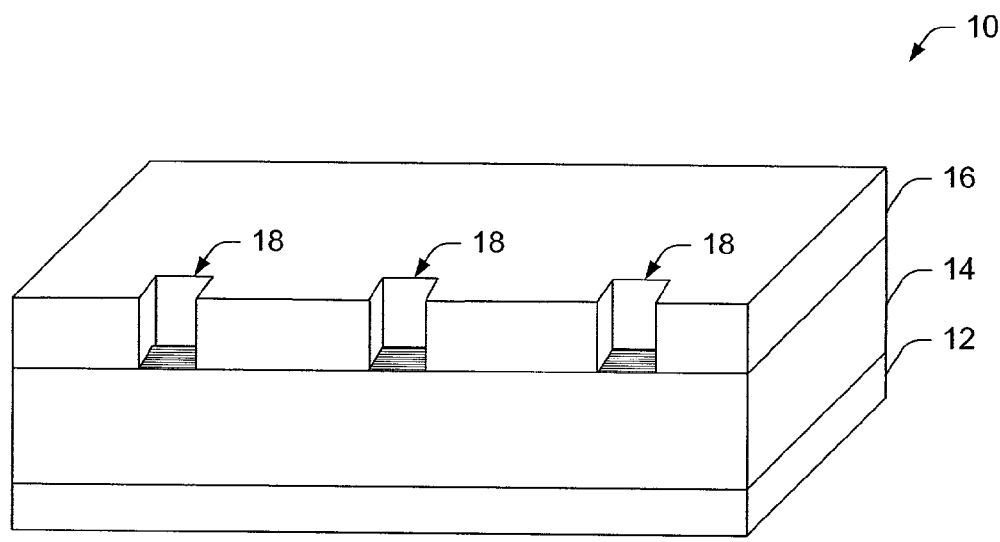
FIG. 1 illustrates a perspective view of a structure at an early fabrication stage according to a prior art dual damascene process.
Figure 2:
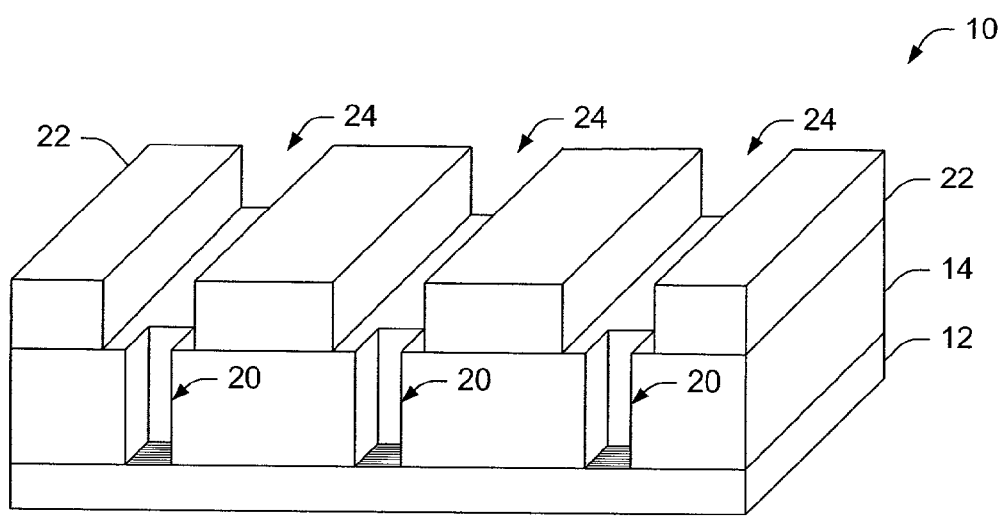
FIG. 2 illustrates a perspective view of the structure of FIG. 1 at a later fabrication stage according to a prior art dual damascene process.
Figure 3:
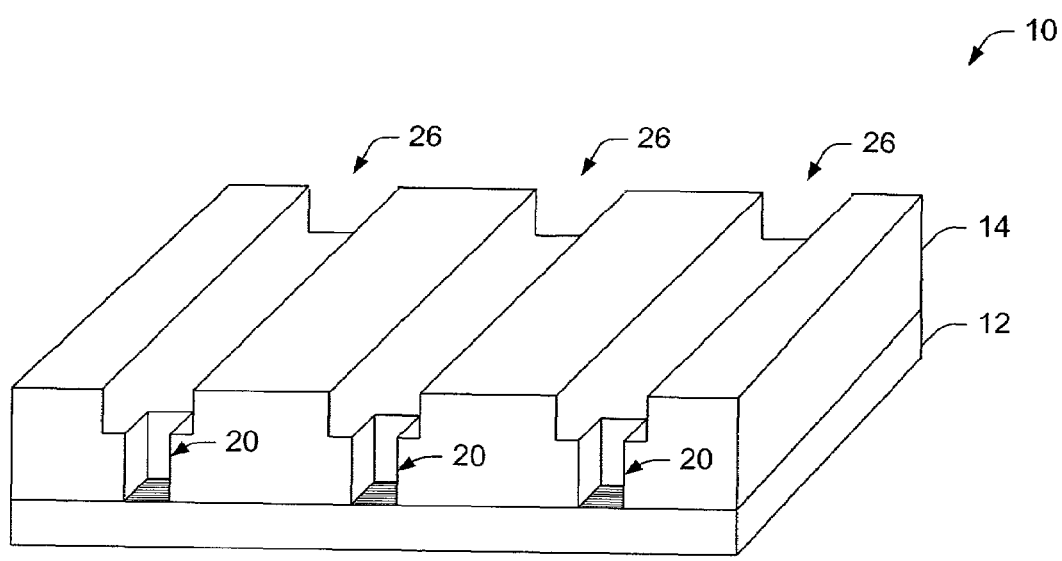
FIG. 3 illustrates a perspective view of the structure of FIG. 2 substantially fabricated according to a prior art dual damascene process.

The present invention involves a method for fabricating interconnecting conductive lines and vias using a dual damascene process. One aspect of the present invention more specifically relates to a method for fabricating interconnecting conductive lines and vias using a modified dual damascene process. The modified dual damascene process involves an integrated dual layering process which facilitates reducing the number of processing (patterning and etching) steps to a single etch process. Conventional dual damascene processes generally employ a two-step etch process wherein a via pattern is first partially etched into an underlying dielectric (oxide) layer. Following, a second etch process is employed to etch a conductive line (trench) pattern into the underlying dielectric layer. In addition, the second etch process typically completes the via pattern etch into the dielectric layer.

Thus, accomplishing the dual damascene pattern in a single etch process improves pattern-transfer fidelity and effectively mitigates damage to the oxide layer (underlying layer) such as rough edges resulting from wafer misalignment and multiple exposures to etchant materials. The single etch process also reduces yield loss and manufacturing costs, both of which are growing concerns in the semiconductor industry.

The integrated dual layering process involves exposing an underlying insulative layer through a dual patterned photoresist layer. As a result of the present invention, a modified dual damascene process is facilitated. Since the dual damascene process is modified, increased fabrication efficiency is obtainable which leads to reduced semiconductor manufacturing costs.

In the present invention, interconnecting conductive lines and vias may be formed in or on a semiconductor structure using a dual damascene process which includes a dual layer patterning scheme. Generally, the dual layer patterning scheme involves etching an underlying layer through a dual patterned photoresist mask. The dual patterned photoresist mask is composed of a first photoresist layer having a first pattern therein and a second photoresist layer having a second pattern therein. In particular, the dual layer patterning scheme involves patterning the first photoresist layer and then curing it in such a way that it is substantially insoluble to conventional organic solvents and developers associated with patterning photoresist films. The second photoresist layer may then be deposited directly over the first patterned photoresist layer and subsequently patterned with a second image.

The first and second photoresist layers may be composed of different material. For example, the first photoresist layer may be a positive tone photoresist material having a photoacid generator (PAG) included therein; and the second photoresist layer may be a negative-tone photoresist material. Positive tone photoresists are commonly employed in lithographic processes. Generally, portions of the positive tone photoresist which are not irradiated are removed during development.

In the case of negative tone photoresist materials, light exposure crosslinks the polymer within the photoresist material so that it cannot be dissolved by a developer. The developer solution removes the unexposed photoresist material, leaving a desired pattern in the crosslinked photoresist. For example, in the present invention, a negative-tone second photoresist layer is patterned using a mask which includes clear and opaque regions. Portions of the mask under which via openings are desired appear opaque. The negative tone second photoresist layer is exposed to light, whereby the light exposure causes the polymer to form crosslinks. The light penetrates the clear regions of the mask and polymerizes or crosslinks the negative photoresist material. The opaque regions, which are not exposed to the light, are dissolved and removed by a developer solution.

The first and second photoresist layer may also have the same thickness, such as in the range from about 0.25 μm to about 1.0 μm. In particular, the thickness of the first and second photoresist layers individually may be from about 0.25 μm to about 0.40 μm; from about 0.45 μm to about 0.60 μm; from about 0.65 μm to about 0.80 μm; and from about 0.85 μm to about 1.0 μm. Alternatively, the thickness of each photoresist layer may differ to an extent necessary to carry out the present invention.

Curing the first patterned photoresist layer (positive tone resist) makes it substantially insoluble and chemically resistant to standard organic solvents and developers typically used to pattern photoresist layers. Thus, curing the first patterned photoresist layer allows the second photoresist to be coated directly thereon and later patterned (i.e., irradiated and developed) without substantially damaging the underlying first patterned photoresist layer. The curing process itself does not substantially affect the underlying insulative or dielectric layer.

Curing a photoresist layer may be accomplished by polymerizing the photoresist layer with actinic radiation such as ultraviolet light for a prescribed amount of time depending on the thickness and type of photoresist layer employed. The ultraviolet light may be directed at the whole photoresist layer or at selected portions of the photoresist layer. The ultraviolet (UV) light stabilizes the photoresist layer by altering its chemical constitution such that it is effectively and substantially resistant to chemicals such as standard organic solvents and conventional developers. Standard organic solvents include, for example, 2-propanol, trichloroethane, and acetone.

The first patterned photoresist (cured) and the second patterned photoresist layers, taken together, form the dual patterned photoresist mask. This dual patterned photoresist mask is employed to transfer (etch) the respective patterns of the first and second photoresist layers in or onto the underlying layer in a single etch process. Thus, the present invention obviates the need for an etch stop layer or an etch stop layer sandwiched between a top and a bottom dielectric layer. The via and conductive line patterns may be transferred directly to the underlying oxide layer without substantially affecting or impacting the substrate which not only reduces fabrication steps, time, and costs but also mitigates the occurrence of errors caused by misalignment of the layers being etched.

In order to transfer the image associated with the second photoresist layer through the cured patterned photoresist layer to the underlying oxide layer, a pre-determined amount of cured photoresist must be removed or ablated. An etch chemistry which is more selective to the cured (polymerized) photoresist over the second photoresist layer can be employed to facilitate the dual layer pattern-image transfer to the underlying oxide layer.

Figure 4:
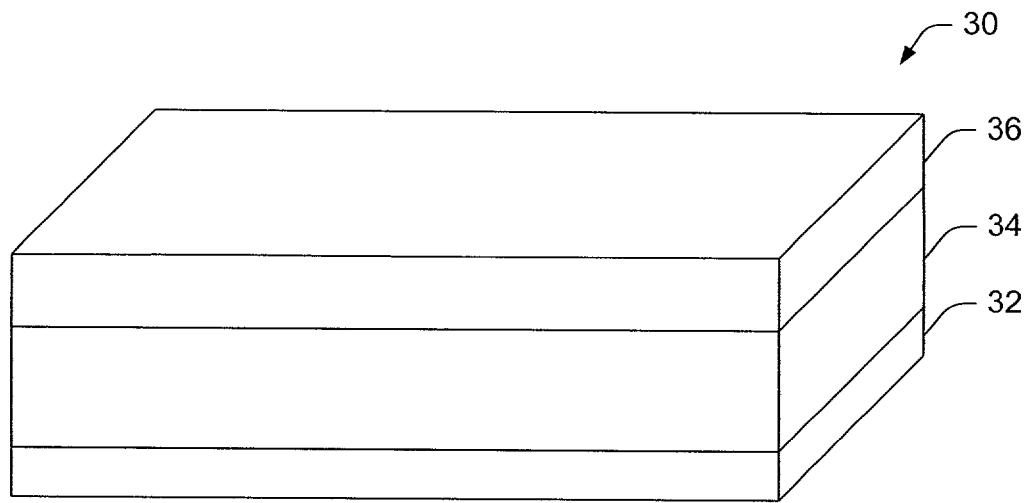
FIG. 4 illustrates a perspective view of a semiconductor structure at an early fabrication stage according to one aspect of the present invention.

Referring now to FIGS. 4–9, a perspective view of a semiconductor structure 30 which is partially completed is shown undergoing a dual photoresist layering process in accordance with the present invention. Once formed, the dual photoresist layer may be used to form a dual damascene pattern in a single etch process in accordance with another aspect of the present invention. FIG. 4 illustrates the semiconductor structure 30 which includes a substrate 32, an insulating layer 34, and a first photoresist layer 36 formed over the insulating layer 34. The insulating layer 34 may be composed of an insulation material such as, for example, silicon nitride, TEOS, BPTEOS, FSG, BPSG, PSG, silicon dioxide or silicon oxynitride. For simplicity purposes, the insulating layer 34 shall be referred to as the oxide layer 34 hereinafter. The first photoresist layer 36 may be a positive tone photoresist comprising a photo acid generator (PAG).

Figure 5:
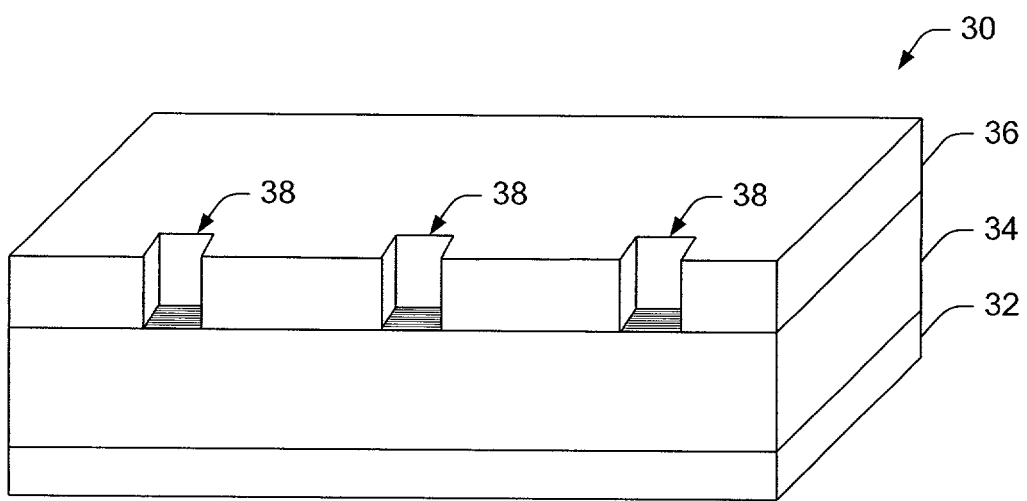
FIG. 5 illustrates a perspective view of the semiconductor structure of FIG. 4 undergoing a process according to one aspect of the present invention.

In FIG. 5, the first patterned photoresist layer 36 has been patterned with via openings. The first patterned photoresist layer 36 is shown having one or more via openings 38 therein. The one or more via openings 38 are patterned in the first photoresist layer 36 such that the underlying oxide layer 34 is exposed at the openings 38. It should be understood that the one or more via openings 38 may be of any suitable depth and width depending on the desired application.

Figure 6:
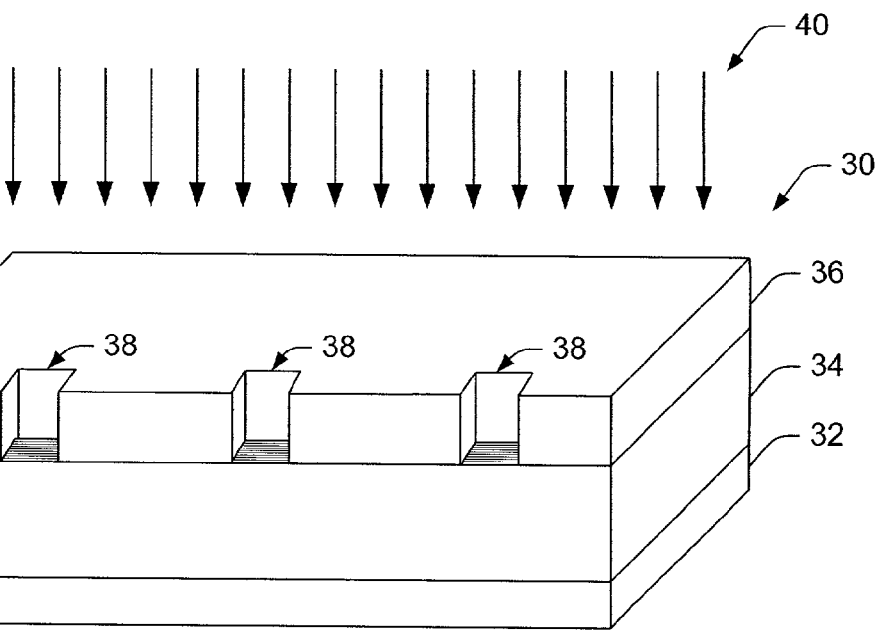
FIG. 6 illustrates a perspective view of the semiconductor structure of FIG. 5 undergoing a process according to another aspect of the present invention.

In FIG. 6, the first patterned photoresist layer 36 is exposed to actinic radiation 40 such as ultraviolet light for a pre-determined time and energy dose sufficient to polymerize and chemically alter the first photoresist layer 36. Essentially, the first patterned photoresist layer 36 is transformed into a UV-stabilized patterned photoresist 42 (FIG. 7) which allows it to be chemically resistant to the effects of organic solvents and/or developers commonly used in photoresist patterning.

Figure 7:
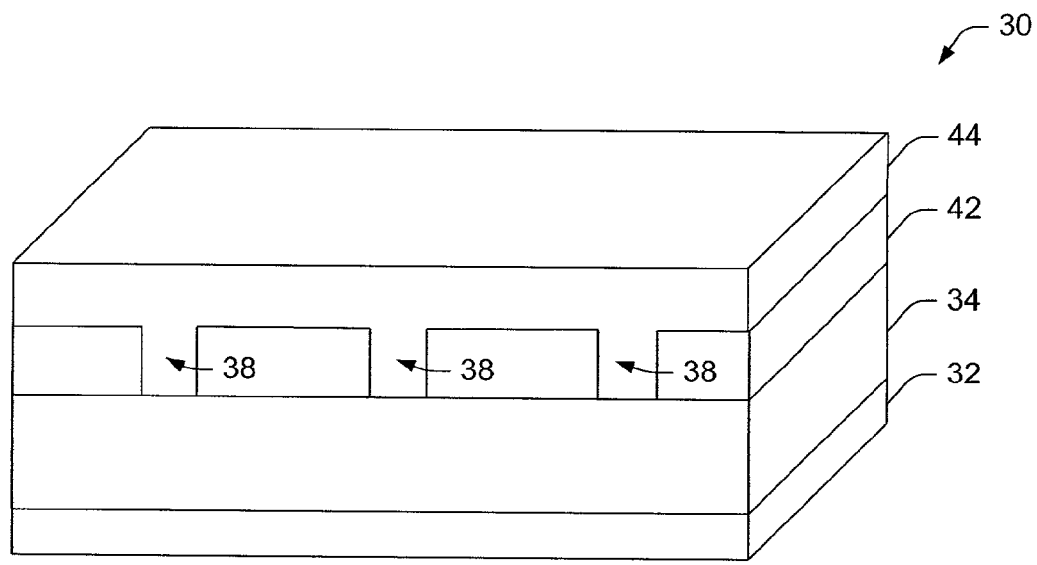
FIG. 7 illustrates a perspective view of the semiconductor structure of FIG. 6 after processing according to one aspect of the present invention.

Turning now to FIG. 7, a second photoresist layer 44 is formed directly over the crosslinked patterned photoresist layer 42 as shown. The second photoresist layer 44 may be composed of negative tone photoresist material. During formation of the second photoresist layer 44 over the polymerized first photoresist layer 42, the one or more via openings 38 are substantially filled with the second (negative) photoresist material.

Figure 8:
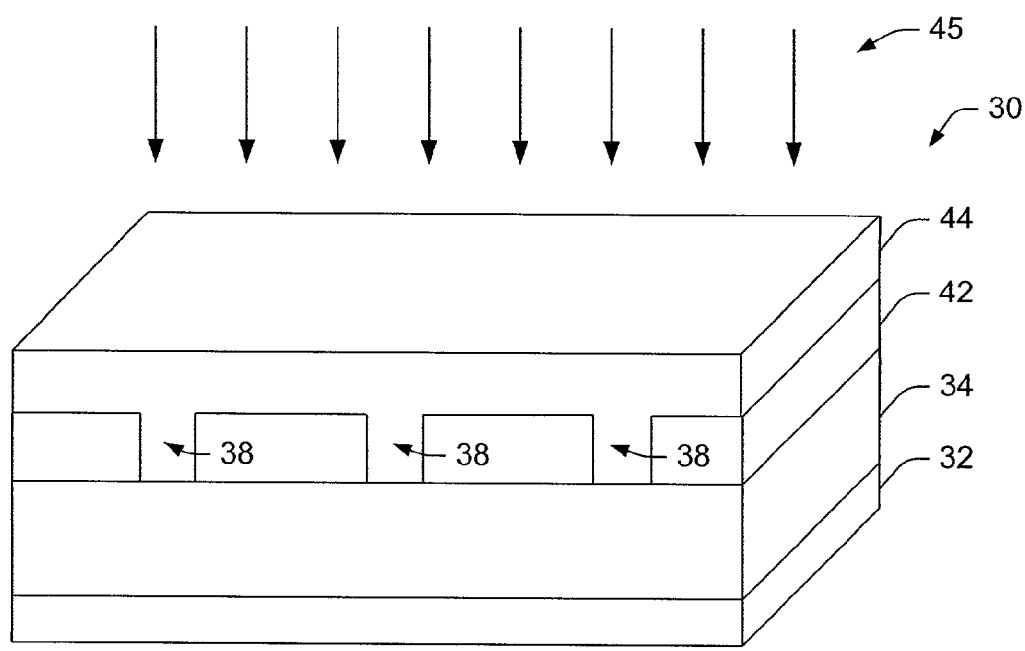
FIG. 8 illustrates a perspective view of the semiconductor structure of FIG. 7 undergoing a process according to another aspect of the present invention.

In FIG. 8, the second photoresist layer 44 (negative photoresist 44) is patterned to form conductive lines using a mask (not shown) having clear and opaque regions. Portions of the mask under which via openings and conductive lines are desired appear opaque; however portions of the mask under which space between the conductive lines is desired appear clear. The negative photoresist layer 44 is exposed to light 45 through the mask (not shown). Due to the chemical nature of the negative photoresist material, the light causes a chemical change in the exposed regions (clear regions of mask) of the negative photoresist 44. This chemical change effectively polymerizes those portions exposed to the light, causing them to be resistant to developer solutions and organic solvents. Thus, portions of the negative photoresist 44 not exposed to the light are removed during development. Therefore, any negative photoresist material 44 present in the one or more via openings 38 is removed without substantial effect, harm or damage to the one or more via openings 38 formed in the polymerized first photoresist layer 42.

Figure 9:
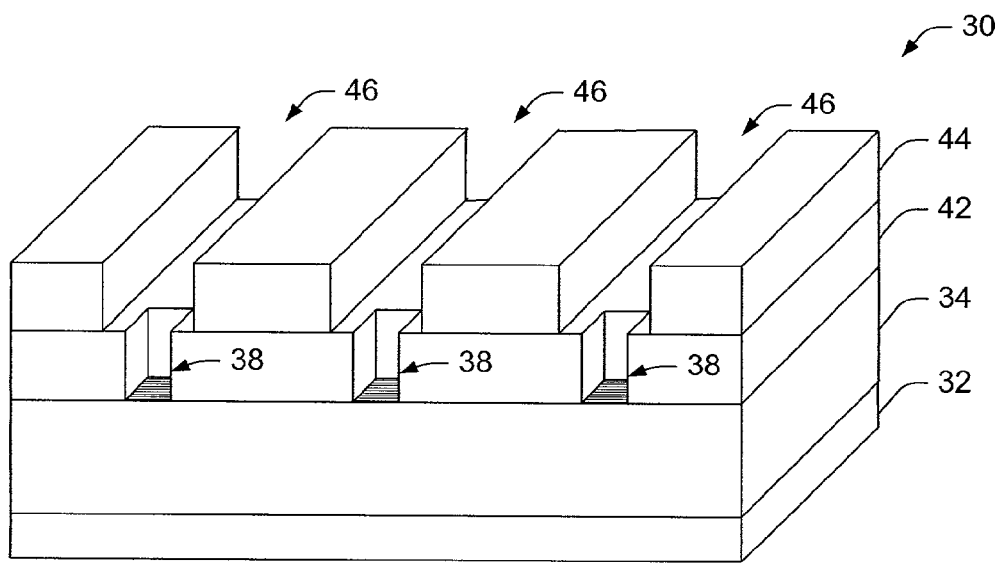
FIG. 9 illustrates a perspective view of a semiconductor structure having a dual layer photoresist mask thereon according to one aspect of the present invention.

As shown in FIG. 9, the negative photoresist layer 44 has one or more conductive lines 46 formed therein. It should be appreciated that the one or more conductive lines 46 may be symmetrically or asymmetrically distributed in the second photoresist layer 44 and may have a width suitable to carry out the present invention. It should be further appreciated that the one or more via openings 38 may be symmetrically or asymmetrically distributed in the first patterned photoresist layer 36 depending on the desired application.

The negative photoresist layer 44 is patterned using an etch chemistry more selective to itself than to the underlying polymerized patterned photoresist 42. That is, there is etch selectivity for the negative (second) photoresist layer 44 over the first photoresist layer 42. Therefore, irradiating the second photoresist layer 44 to form the one or more conductive lines pattern may not substantially damage or affect the one or more via openings 38 formed in the polymerized first photoresist layer 42.

The structure 30 shown in FIG. 9 illustrates a dual layer patterning approach to a dual damascene process. The second patterned photoresist layer 44 and the underlying first (polymerized) patterned photoresist layer 42 form a dual photoresist mask through which the underlying oxide layer 34 may be etched in a single etch process. According to one aspect of the present invention, the dual photoresist mask (42, 44) may transfer its image to the oxide layer 34 in a single etch process using a suitable energy dose and time sufficient to fabricate the structure 30. A suitable etch chemistry may be employed in order to ablate a pre-determined amount of the polymerized first photoresist layer 42 during the etching process. The suitable etch chemistry may involve conventional wet etching processes able to penetrate polymerized photoresist films.

Figure 10:
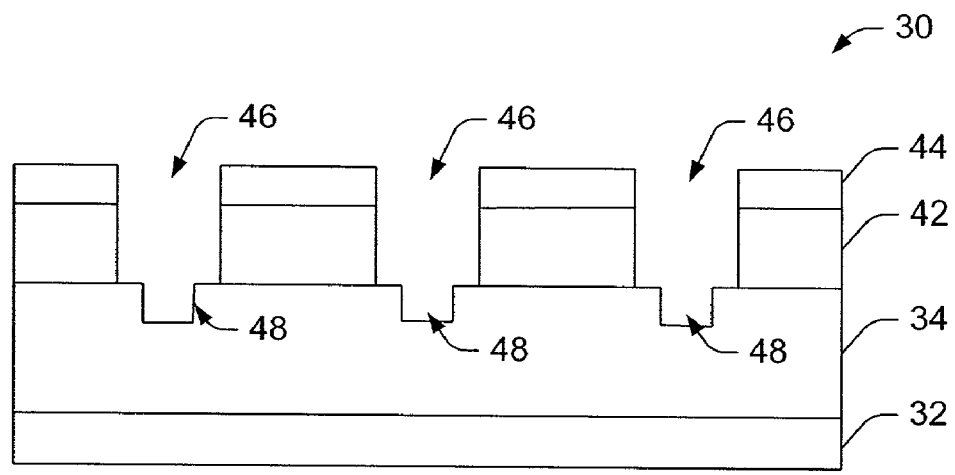
FIG. 10 illustrates a cross-sectional view of the semiconductor structure of FIG. 9 partially etched according to another aspect of the present invention.

Referring now to FIG. 10, a cross-sectional view of the semiconductor structure 30 undergoing a single anisotropic etch process is shown. During the single etch process, the oxide layer 34 is anisotropically etched by exposing the dual photoresist mask (42, 44) to a suitable etchant. Examples of suitable etchants include those that are highly selective or more selective to the polymerized photoresist layer 42 and the underlying layer 34 over the negative patterned photoresist layer 44. The etch selectivity of a suitable etchant may be 20:1, 10:1, 5:1 and 2:1. For example, the etchant is twenty times more selective to the polymerized photoresist 42 than to negative photoresist 44.

Still referring to FIG. 10, the structure 30 is shown at about a point midway through the single etch process. As can be seen, the etchant has etched through the polymerized photoresist layer 42 to expose portions of the oxide layer 34 corresponding to dimensions of the conductive lines 46. In addition, the one or more via openings 38 have been partially etched into the oxide layer 34 to partially form one or more via openings 48. A small portion of the negative photoresist layer 44 have also been etched away at this point of the etch process. This is because the structure 30 is undergoing a single anisotropic etch process using an etchant. Although the etchant is more selective to the polymerized positive photoresist 42 and to the underlying layer 34, it still affects the negative photoresist 44, albeit at a substantially slower pace. However, the structural integrity of the dual layer mask remains substantially intact to effectively complete the etch process.

Figure 11:
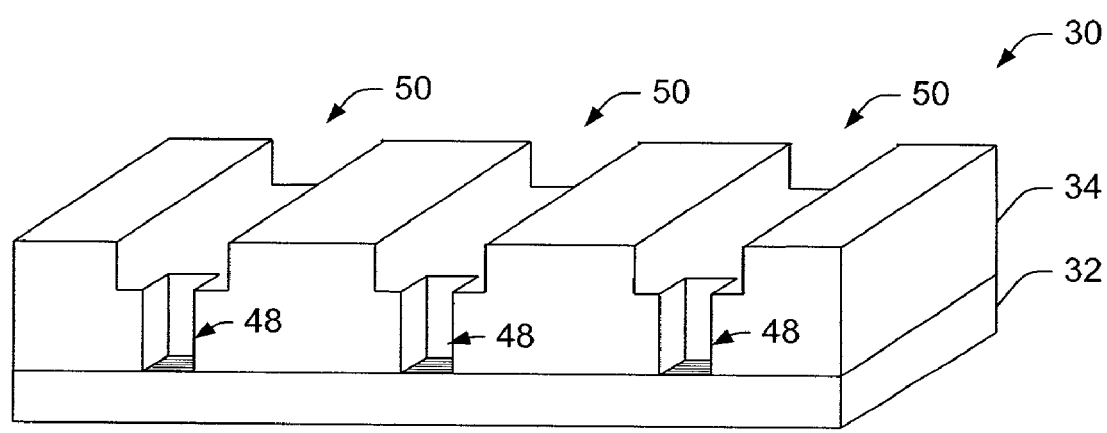
FIG. 11 illustrates a perspective view of the semiconductor structure of FIG. 10 substantially fabricated according to yet another aspect of the present invention.

FIG. 11 shows the structure 30 substantially completed. A pattern for the one or more via openings 38 have been transferred to the oxide layer 34 to form one or more vias 48. Likewise, a pattern of the one or more conductive lines 46 have been transferred to the oxide layer 34 to form one or more conductive lines 50. Unlike conventional dual damascene processes, the present invention allows the via and conductive line patterns to be transferred to the underlying oxide layer 34 in a single etch process. The single etch process may be defined as a single exposure of radiation/etchant through the dual layer mask. That is to say, the oxide layer 34 is not exposed to one or more etchants more than one time for a pre-determined length of time. In particular, a first image (via pattern) and a second image (conductive line pattern) are transferred simultaneously from the dual layer mask to the underlying layer. Moreover, process steps may be reduced and/or eliminated which facilitates decreasing yield loss, costs, and time constraints. Forming a dual damascene in a fewer number of etch processes mitigates damage to the oxide layer which may be caused by repeated patterning and etching (multiple exposures to etchants).

Examples of damage to the oxide layer include rough edge lines, undesired etching of previously etched devices (e.g., via) and the like.

Removal of the dual photoresist mask (42, 44) may be necessary, however the negative photoresist 44 may have already been substantially removed from the structure 30 during the course of the etching process. In any case, it should be understood that the dual photoresist mask may be removed from the structure 30 using one or more conventional resist stripper compositions formulated to remove traditional photoresist films as well as polymerized photoresist films. Examples of crosslinked resist stripper compositions include trichloroethylene and methylene chloride solution such as a methylene chloride containing from about 5 to about 10 volume percent of a mixture of methanol and methyl formate combined with an epoxide present at an amount no greater than about 0.5 volume percent. Other removers suitable to strip crosslinked and/or polymerized photoresist layers may also be employed to carry out the present invention.

Once the via and conductive line patterns have been substantially formed in the dielectric or insulative underlying layer, such layer may be filled with a metal or a conductive polymer material, depending on the desired application.

Moreover, the present invention facilitates a modified dual damascene process which effectively reduces the number of processing (patterning and etching) steps required by conventional dual damascene techniques to a single etch process. Furthermore, the present invention obviates the need for an etch stop layer in general or an etch stop layer sandwiched between a top and a bottom dielectric layer. Because the via and conductive line patterns may be transferred directly to the underlying oxide layer during a single etch process without substantially affecting the substrate, fabrication steps, time, and costs may be reduced and the occurrence of errors caused by misalignment of the layers being etched may be mitigated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for making a dual damascene pattern in a single etch process comprising:
    providing a wafer having at least one insulative layer formed thereon;
    depositing a first photoresist layer over the at least one insulative layer;
    patterning a first image into the first photoresist layer;
    curing the first patterned photoresist layer;
    depositing a second photoresist layer over the first patterned photoresist layer;
    patterning a second image into the second photoresist layer; and
    etching the at least one insulative layer through the first patterned photoresist layer and the second patterned photoresist layer simultaneously in the single etch process, wherein the first image and the second image are substantially formed in the at least one insulative layer.

2. The method of claim 1, wherein curing the first patterned photoresist layer comprises irradiating the first patterned photoresist layer with ultraviolet light.

3. The method of claim 2, wherein the ultraviolet light irradiates the first patterned photoresist layer for a time and at an energy dose sufficient to make the first patterned photoresist chemically resistant to organic solvents and developers.

4. The method of claim 1, wherein etching the at least one insulative layer through the first patterned photoresist layer and the second patterned photoresist layer further comprises employing an etch chemistry that ablates an amount of the first patterned photoresist layer during the etching process without substantially affecting the second patterned photoresist layer.

5. The method of claim 4, wherein the etch chemistry is highly selective to the first patterned photoresist layer and to the at least one insulative layer than to the second patterned photoresist layer.

6. The method of claim 1, further comprising removing the first patterned photoresist layer and the second patterned photoresist layer.

7. The method of claim 1, wherein the first patterned photoresist layer is a positive tone photoresist layer.

8. The method of claim 1, wherein the second patterned photoresist layer is a negative tone photoresist layer.

9. A method for making a dual damascene pattern using a dual layer patterning scheme and a single etch process comprising:
    providing a wafer having at least one insulative layer formed thereon;
    depositing a first photoresist layer over the at least one insulative layer;
    patterning a first image in the first photoresist layer;
    irradiating the first patterned photoresist layer with ultraviolet light to stabilize the first patterned photoresist layer;
    depositing a second photoresist layer on the first patterned photoresist layer;
    patterning a second image in the second photoresist layer;
    etching the at least one insulative layer through the first patterned photoresist layer and the second patterned photoresist layer simultaneously in the single etch process, wherein the first image and the second image are substantially formed in the at least one insulative layer; and
    removing the first patterned and the second patterned photoresist layers.

10. The method of claim 9, wherein irradiating the first patterned photoresist layer with ultraviolet light is for a time and at an energy dose sufficient to make the first patterned photoresist chemically resistant to organic solvents and developers.

11. The method of claim 9, wherein etching the at least one insulative layer through the first patterned photoresist layer and the second patterned photoresist layer further comprises employing an etch chemistry that ablates an amount of the first patterned photoresist layer during the etching process without substantially affecting the second patterned photoresist layer.

12. The method of claim 11, wherein the etch chemistry is highly selective to the first patterned photoresist layer and to the at least one insulative layer than to the second patterned photoresist layer.

13. The method of claim 9, wherein the first patterned photoresist layer is a positive tone photoresist layer.

14. The method of claim 9, wherein the second patterned photoresist layer is a negative tone photoresist layer.

15. A method for making a dual damascene pattern using a dual layer patterning scheme comprising:

provifing a wafer having at least one insulative layer formed thereon;

depositing a positive tone photoresist layer over the at least one insulative layer;

patterning a first image in the positive tone photoresist layer;

irradiating selected portions of the positive tone photoresist through a mask to effect an image-wise pattern transfer, wherein irradiated portions of the positive tone photoresist layer are removed;

polymerizing first patterned photoresist layer using ultraviolet light radiation;

depositing a negative tone photoresist layer over patterned positive tone photoresist layer;

irradiating selected portions of the negative tone photoresist through a mask to effect an image-wise pattern transfer, wherein non-irradiated portions of the negative tone photoresist layer are removed;

etching the at least one insulative layer through the patterned positive tone photoresist layer and the patterned negative photoresist layer simultaneously in a single etch process, wherein the first image and the second image are substantially formed in the at least one insulative layer; and removing the patterned positive tone and the patterned negative tone photoresist layers.

16. The method of claim 15, wherein polymerized portions of the positive tone photoresist layer are chemically resistant to standard developer solutions and organic solvents.

17. The method of claim 15, wherein etching the at least one insulative layer through the patterned negative tone photoresist layer and the patterned positive tone photoresist layer further comprises employing an etch chemistry that ablates an amount of the patterned positive tone photoresist layer during the etching process without substantially affecting the patterned negative tone photoresist layer.

18. The method of claim 17, wherein the etch chemistry is highly selective to the patterned negative tone photoresist layer and to the at least one insulative layer than to the patterned positive tone photoresist layer.

* * * * *